(12) United States Patent
Jang et al.

(10) Patent No.: US 9,426,890 B2
(45) Date of Patent: Aug. 23, 2016

(54) DISPLAY APPARATUS

(71) Applicant: SAMSUNG ELECTRONICS CO., LTD., Suwon-si (KR)

(72) Inventors: Hyo Jae Jang, Gangneung-si (KR); Chan Hong Park, Anyan-si (KR); Jeong Ho Bang, Seoul (KR); Jong Myung Lee, Seoul (KR); Sun Weon Jeong, Yongin-si (KR); Hyeong Sik Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/474,643

(22) Filed: Sep. 2, 2014

(65) Prior Publication Data

US 2015/0245488 A1 Aug. 27, 2015

Related U.S. Application Data

(60) Provisional application No. 61/943,640, filed on Feb. 24, 2014.

(30) Foreign Application Priority Data

Jun. 13, 2014 (KR) .......................... 10-2014-0072403

(51) Int. Cl.
G02F 1/1345 (2006.01)
H05K 1/14 (2006.01)
(Continued)

(52) U.S. Cl.
CPC .................. *H05K 1/147* (2013.01); *G06F 1/16* (2013.01); *H05K 1/028* (2013.01); *H05K 1/189* (2013.01); *H05K 2201/05* (2013.01); *H05K 2201/09145* (2013.01); *H05K 2201/10128* (2013.01)

(58) Field of Classification Search
CPC ........... H01L 2924/14; G02F 1/13452; G02F 1/1333; G02F 1/1345; G02F 1/13305; G02F 1/1335; G02F 1/133615; G02F 1/133305; H05K 3/361; H05K 3/0097; H05K 3/0052; H05K 1/0393; H05K 1/147; H05K 1/189; H05K 1/028; H05K 1/14; H05K 1/142; H05K 1/117; H05K 1/118; H05K 7/1092; H05K 2201/09254; H05K 2201/09663; H05K 2201/10136; H05K 2201/10681; G06K 19/07; G06K 19/07745; G06K 19/077
USPC ........... 361/749; 349/139, 150, 151, 65, 158
See application file for complete search history.

(56) References Cited

U.S. PATENT DOCUMENTS 5,670,994 A * 9/1997 Kawaguchi ......... G02F 1/13452
257/E23.065
6,278,509 B1 * 8/2001 Ohga et al. ................... 349/150
(Continued)

FOREIGN PATENT DOCUMENTS

JP 01-064626 U 4/1989
JP 03-058025 A 3/1991
(Continued)

OTHER PUBLICATIONS

Communication dated Mar. 4, 2015, issued by the European Patent Office in counterpart European Application No. 14195717.5.
(Continued)

*Primary Examiner* — Thoi Duong
(74) *Attorney, Agent, or Firm* — Sughrue Mion, PLLC

(57) ABSTRACT

Disclosed herein is a display apparatus that reduces a magnitude of a tension applied to a flexible PCB when a display panel is provided with a curved surface, and prevents damage of a driving chip. The display apparatus in accordance with exemplary embodiments includes a display panel configured to display an image, a source printed circuit board configured to control the display panel, and a flexible PCB that connects the display panel and the source printed circuit board. A length of at least one side edge of the flexible PCB is formed longer than a minimum length from the display panel to the source printed circuit board.

15 Claims, 11 Drawing Sheets

(51) Int. Cl.
*G06F 1/16* (2006.01)
*H05K 1/02* (2006.01)
*H05K 1/18* (2006.01)

(56) References Cited

U.S. PATENT DOCUMENTS

| | | | |
|---|---|---|---|
| 7,436,668 B2 * | 10/2008 | Bae | G06F 1/1601 349/58 |
| 8,111,347 B2 * | 2/2012 | Koganezawa | 349/58 |
| 8,223,291 B2 * | 7/2012 | Kim | 349/58 |
| 2001/0033009 A1 * | 10/2001 | Inoue | H05K 7/20963 257/668 |
| 2007/0182911 A1 * | 8/2007 | Cha | 349/150 |
| 2008/0137275 A1 | 6/2008 | Tada | |
| 2008/0291379 A1 * | 11/2008 | Takenaka et al. | 349/150 |
| 2009/0153790 A1 | 6/2009 | Tashiro | |
| 2009/0316062 A1 * | 12/2009 | Nishizawa | G02F 1/133305 349/58 |
| 2010/0207847 A1 | 8/2010 | Kim | |
| 2013/0148312 A1 * | 6/2013 | Han | H05K 7/00 361/736 |
| 2013/0155655 A1 | 6/2013 | Lee et al. | |
| 2013/0170157 A1 * | 7/2013 | Park | 361/749 |
| 2015/0002785 A1 * | 1/2015 | Huang et al. | 349/65 |

FOREIGN PATENT DOCUMENTS

| | | | | |
|---|---|---|---|---|
| JP | 07-325315 | A | | 12/1995 |
| JP | 2000-187452 | A | | 7/2000 |
| JP | 2001-109391 | A | | 4/2001 |
| JP | 2010-145731 | A | | 7/2010 |
| KR | 10-2006-0060993 | | * 6/2006 | H01J 17/49 |
| KR | 10-2008-0022442 | A | | 3/2008 |
| KR | 10-2008-0032344 | A | | 4/2008 |
| KR | 10-2012-0031368 | A | | 4/2012 |
| KR | 10-2012-0052764 | A | | 5/2012 |

OTHER PUBLICATIONS

Communication dated Mar. 16, 2015, issued by the European Patent Office in counterpart European Application No. 14195717.5.
Communication dated Feb. 6, 2015, issued by the Korean Intellectual Property Office in counterpart Korean Application No. 10-2014-0072403.
Communication dated May 7, 2015, issued by the International Searching Authority in counterpart International Application No. PCT/KR2015/000742.
Communication dated Nov. 6, 2015 issued by the European Patent Office in counterpart European Patent Application No. 14 195 717.5.
Communication dated May 9, 2016, issued by the European Patent Office in counterpart European Application No. 14195717.5.

* cited by examiner

DISPLAY APPARATUS

CROSS-REFERENCE TO RELATED APPLICATION

This application claims priority from Korean Patent Application No. 10-2014-72403, filed on Jun. 13, 2014 in the Korean Intellectual Property Office and U.S. Patent Application No. 61/943,640, filed on Feb. 24, 2014 in the United States Patent and Trademark Office, the disclosure of which is incorporated herein by reference.

BACKGROUND

1. Field

Exemplary embodiments relate to a display apparatus.

2. Description of the Related Art

A display apparatus is an apparatus that visually displays data information such as characters, figures, and the like. The display apparatus includes a liquid crystal display device and a driving circuit that drives the liquid crystal display device. The liquid crystal display device is a passive optical device that does not emit light by itself. Therefore, the liquid crystal display device may display an image using a backlight unit attached to a rear surface of the liquid crystal display device.

In recent years, a related art curved display device having a curvature that is changed while proceeding in both right and left directions with respect to a center portion thereof has been used. When the related art display apparatus is formed with a curved surface, information displayed by the display apparatus can be recognized by people within a broad range regardless of directions.

The related art display apparatus includes a display panel on which an image is formed, a source printed circuit board that controls the display panel, and a flexible printed circuit board (PCB) that connects the display panel and the source printed circuit board. In the flexible PCB, a driving chip may be mounted. A bottom chassis in which a backlight unit is positioned may be provided on the rear side of the display panel.

The related art display panel is connected to one side of the flexible PCB, and the source printed circuit board is connected to the other side thereof. Therefore, when the flexible PCB is bent, the source printed circuit board may be positioned on the rear side of the related art display panel.

SUMMARY

Exemplary embodiments may provide a display apparatus that can prevent damage of a flexible PCB. According to the exemplary embodiments, when a display panel is formed with a curved surface, it is possible to prevent the flexible PCB from being torn by a tension applied to the flexible PCB. In addition, when the flexible PCB is bent, it is possible to prevent damage of a driving chip by the edges of a bottom chassis or the like.

Additional aspects of the exemplary embodiments will be set forth in part in the description which follows and, in part, will be obvious from the description, or may be learned by practice of the exemplary embodiments.

In accordance with one aspect of an exemplary embodiment, a display apparatus includes: a display panel configured to display an image; a source printed circuit board configured to control the display panel; and a flexible printed circuit board (PCB) that connects the display panel and the source printed circuit board, wherein a width of an upper end portion or a lower end portion of the flexible PCB is longer than a width of a center portion of the flexible PCB.

A driving chip may be disposed in the flexible PCB at a position biased to one of the source printed circuit board side and the display panel side and offset from a center portion of the flexible PCB.

Also, the driving chip may be disposed at the position biased to the source printed circuit board side and offset from the center of the flexible PCB, and disposed on a rear side of the display panel when the flexible PCB is bent.

Also, a plurality of source printed circuit boards may be provided.

Also, a cut portion incised toward an inner side of the flexible PCB may be disposed on at least one side of the flexible PCB.

Also, the flexible PCB may be provided so as to incline in a direction oblique with respect to one side end portion of the display panel or one side end portion of the source printed circuit board.

Also, when the plurality of source printed circuit boards are provided, an oblique direction of the flexible PCB connected to one source printed circuit board may be different from an oblique direction of the flexible PCB connected to the other source printed circuit board.

Also, the flexible PCB may include a first portion connected to one of the display panel and the source printed circuit board, a second portion connected to the other of the display panel and the source printed circuit board, and a connection portion which connects the first portion and the second portion.

Also, the first portion may extend away from one side end of the connection portion in a first direction, and the second portion may extend away from the other side end of the connection portion in a second direction.

Also, a bottom chassis may be disposed on a rear side of the display panel, and the flexible PCB may be bent so that the source printed circuit board is disposed on a rear side of the bottom chassis.

Also, when the flexible PCB is bent so as to wrap a part of the bottom chassis, the driving chip mounted in the flexible PCB may be disposed so as not to be interfered with by edges of the bottom chassis.

Also, when the flexible PCB is bent so as to wrap the part of the bottom chassis, the driving chip mounted in the flexible PCB may be disposed on the rear side of the display panel.

Also, when the flexible PCB is bent so as to wrap the part of the bottom chassis, the driving chip mounted in the flexible PCB may be disposed on a front side on which the display panel is disposed.

Also, a top chassis for fixing a front side of the display panel may be disposed on the front side of the display panel.

Also, a plurality of flexible PCBs may be provided, and a separation member may be positioned between the flexible PCBs adjacent to each other to support the top chassis.

In accordance with another aspect of the exemplary embodiments, a display apparatus includes: a display panel that is bent so as to have a predetermined curvature; a source printed circuit board configured to control the display panel; and a flexible printed circuit board (PCB) that connects the display panel and the source printed circuit board, and the flexible PCB includes a driving chip mounted at a position biased to the source printed circuit board side or the display panel side and offset from a center portion of the flexible PCB, wherein a part of at least one side edge of the flexible PCB extends in a direction oblique with respect to one end portion of the display panel.

Here, a plurality of source printed circuit boards may be provided.

Also, a cut portion may be disposed on the at least one side edge of the flexible PCB.

Also, the flexible PCB may be disposed so as to incline in a direction oblique with respect to one side end portion of the display panel or one side end portion of the source printed circuit board.

In accordance with still another aspect of the exemplary embodiments, a display apparatus includes: a bendable display panel; a plurality of source printed circuit boards configured to control the display panel; a plurality of flexible printed circuit boards (PCBs) that connect one side of the bendable display panel and one side of the source printed circuit boards; and a bottom chassis that includes a backlight unit and is disposed on a rear side of the bendable display panel, wherein a cut portion in which at least a part of the respective flexible PCBs is incised is disposed on at least one side of the respective flexible PCBs.

A driving chip may be disposed in each of the flexible PCBs and mounted at a position biased to the source printed circuit boards side or the bendable display panel side and offset from a center portion of the respective flexible PCBs.

Also, when the flexible PCBs are bent, the driving chip may be positioned on a rear side of the bendable display panel.

Also, the flexible PCBs may be disposed so as to incline in a direction oblique with respect to one side end portion of the bendable display panel or one side end portion of the source printed circuit boards.

In accordance with yet another aspect of the exemplary embodiments, a display apparatus includes: a bendable display panel; a source printed circuit board configured to control the bendable display panel; and a flexible printed circuit board (PCB) that connects the bendable display panel and the source printed circuit board, wherein a cut portion in which at least a part of the flexible PCB is incised is disposed on at least one side of the flexible PCB.

BRIEF DESCRIPTION OF THE DRAWINGS

These and/or other aspects of the exemplary embodiments will become apparent and more readily appreciated from the following description of the embodiments, taken in conjunction with the accompanying drawings of which.

DETAILED DESCRIPTION OF EXEMPLARY EMBODIMENTS

Figure 1:
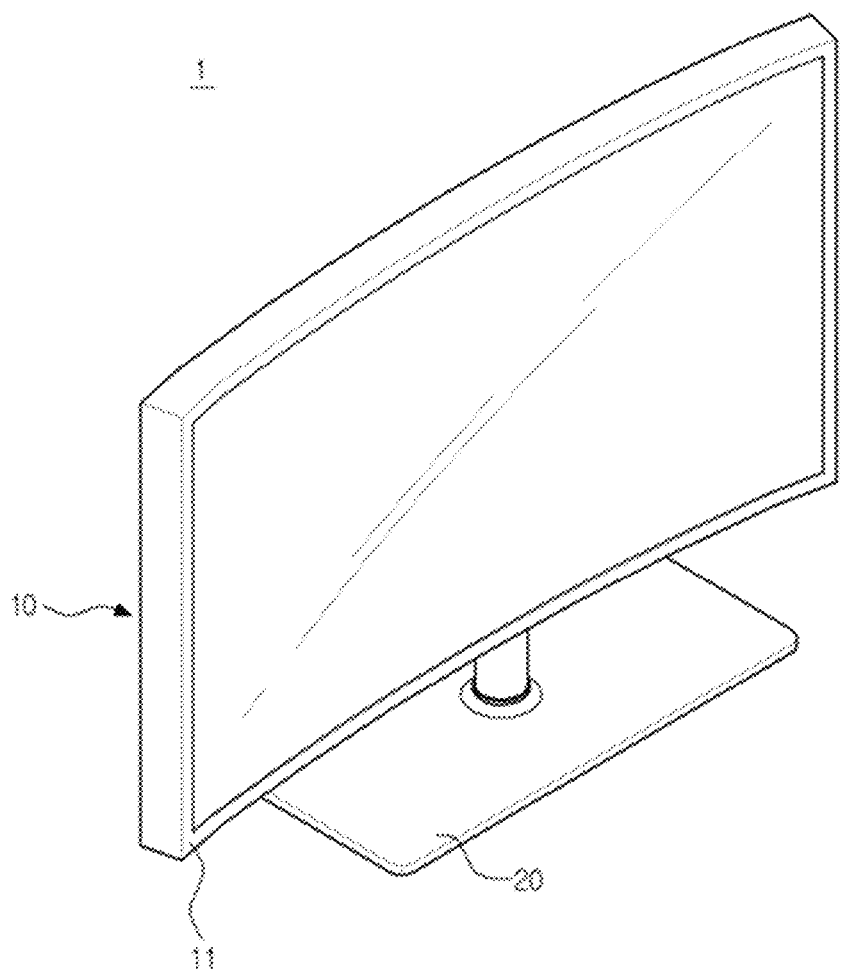
FIG. 1 is a perspective view showing a display apparatus in accordance with an exemplary embodiment.

Reference will now be made in detail to the exemplary embodiments, examples of which are illustrated in the accompanying drawings, wherein like reference numerals refer to like elements throughout.

Hereinafter, a display apparatus in accordance with an exemplary embodiment will be described in detail with the accompanying drawings.

Figure 2:
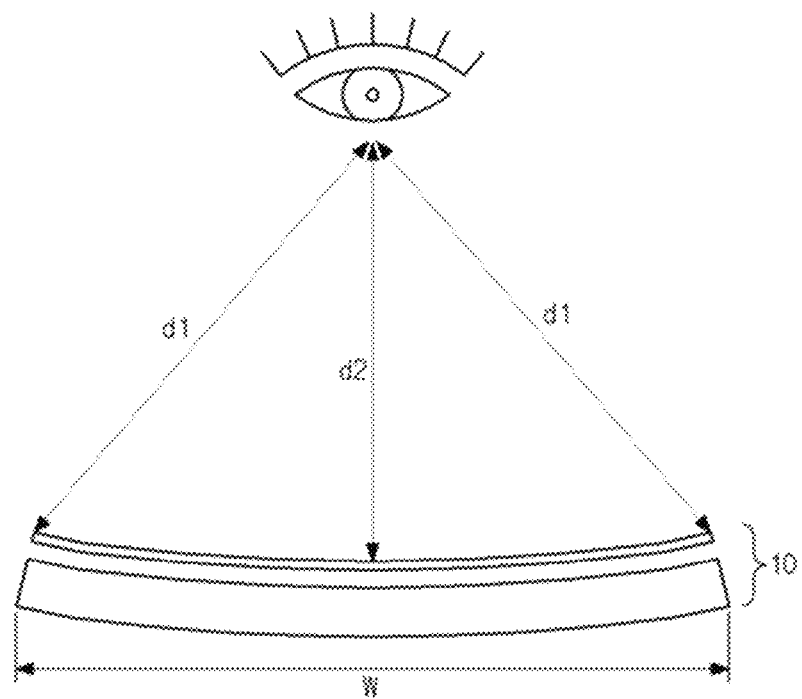
FIG. 2 is a view showing an example of a viewing angle of a display apparatus in accordance with an exemplary embodiment.

FIG. 1 is a perspective view showing a display apparatus in accordance with an exemplary embodiment, and FIG. 2 is a view showing an example of a viewing angle of a display apparatus in accordance with an exemplary embodiment.

Referring to FIG. 1 and FIG. 2, a display apparatus 1 is a device that displays images such as a television, a monitor, or the like. The display apparatus 1 may include a main body 10 that displays an image while having a predetermined curvature, and a stand 20 that is mounted on the bottom of the main body 10 to support the main body 10. The main body 10 may be provided on a wall using a bracket or the like without the stand 20.

The main body 10 includes an image display surface having a predetermined curvature in a width (W) direction. When a user is positioned in a front center of the main body 10, the main body 10 of the display apparatus 1 may be provided to have a predetermined curvature so that a distance d1 between left and right end portions of the image display surface and a visual field of the user positioned at a specific position and a distance d2 between the center of the image display surface and the visual field of the user are identical or similar to each other. That is, the left and right end portions of the display apparatus 1 are provided so as to protrude forward in relation to the center portion. The main body 10 is provided so as to have a predetermined curvature. Therefore, the user can view two-dimensional (2D) images having a three-dimensional (3D) effect or natural 3D images.

Figure 3A:
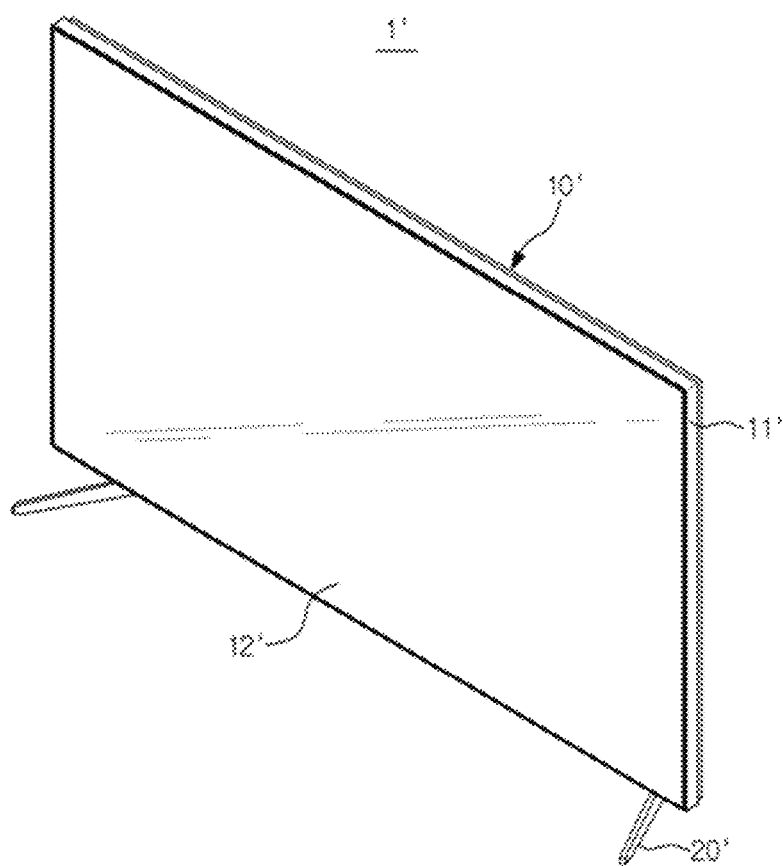
FIGS. 3A and 3B are perspective views showing a display apparatus in accordance with another exemplary embodiment.
Figure 3B:
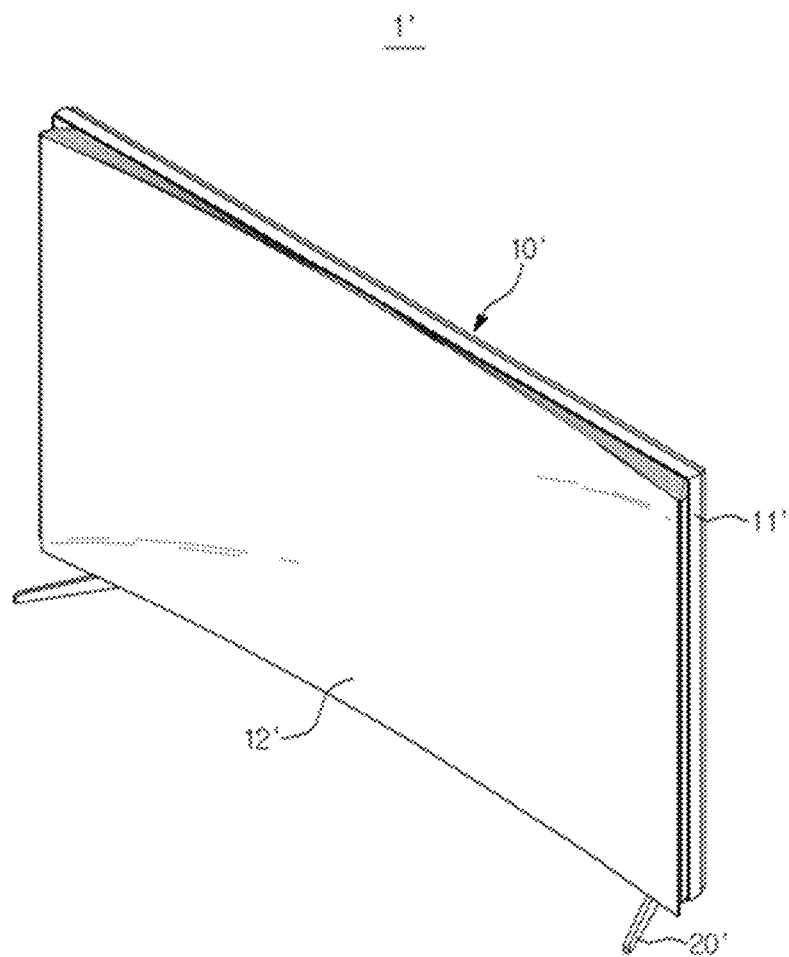

FIGS. 3A and 3B are perspective views showing a display apparatus in accordance with another exemplary embodiment.

Referring to FIGS. 3A and 3B, a display apparatus 1' in accordance with another exemplary embodiment is deformably provided in such a manner that both ends of a display panel 12' protrude forward in relation to the center portion thereof.

A main body 10' of the display apparatus 1' includes a case 11', and the display panel 12' is accommodated in the case 11'. The main body 10' may be supported by a stand 20'. The main body 10' may be provided on a wall using a bracket or the like without the stand 20'.

The display panel 12' can be deformed so as to be in a flat surface state as shown in FIG. 3A, or deformed so that both side ends of the display panel 12' protrude forward to be in a curved surface state with a predetermined curvature.

As an example, the display panel 12' can be deformed to be in the flat surface state or the curved surface state by a driving device. The rear center of the display panel 12' is fixed to the case 11', and the driving device and both rear left and right sides of the display panel 12' can be connected by a hinge device. The hinge device receives a driving force from the driving device to push both left and right sides of the display panel 12' so that the display panel 12' protrudes forward, and pull the both left and right sides thereof so that the surface of display panel 12' becomes flat.

The user may use the display panel 12' by bending the display panel 12' or holding the display panel 12' in the flat surface state.

Hereinafter, the display apparatus 1 in accordance with an exemplary embodiment will be described. Description of a structure of the flexible printed circuit board (PCB) applied to the display apparatus 1 in accordance with an exemplary embodiment may be similarly applied to the display apparatus 1' in accordance with another exemplary embodiment.

Figure 4:
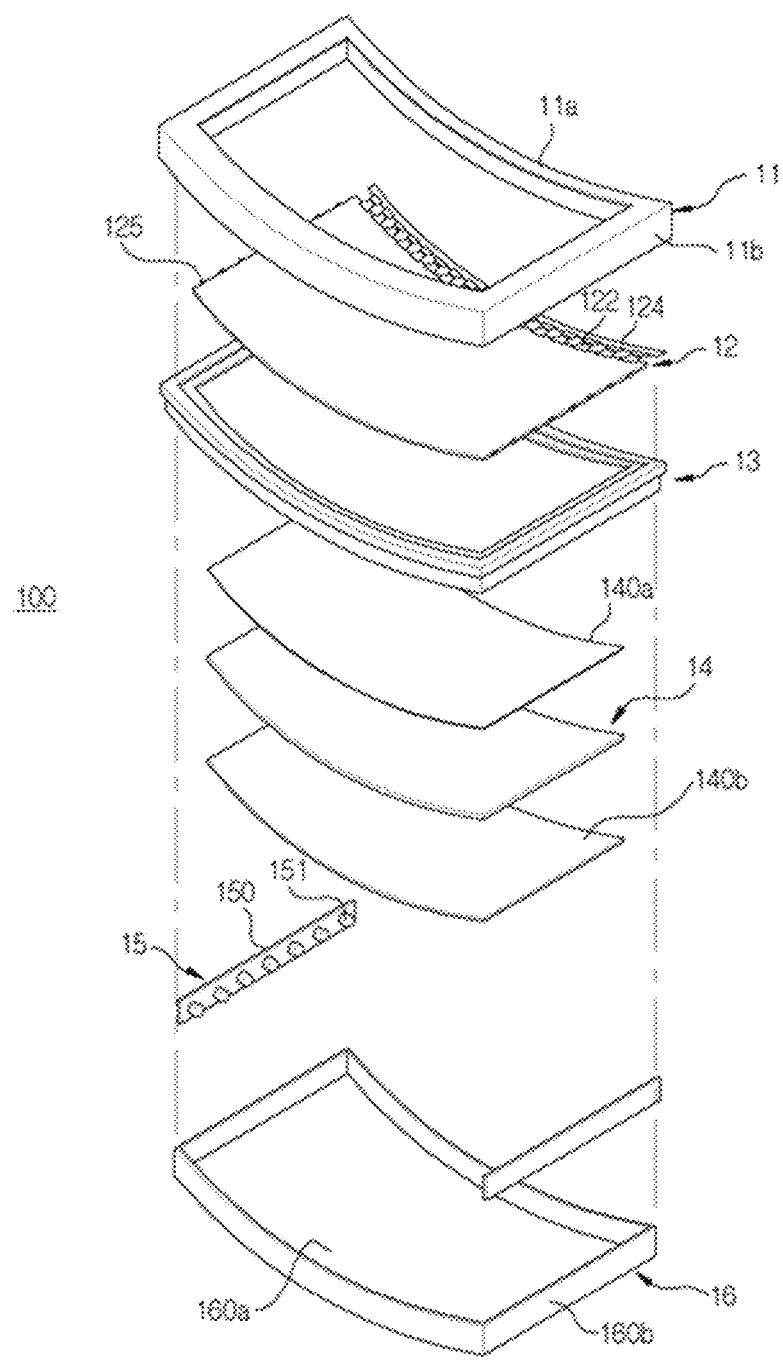
FIG. 4 is an exploded perspective view showing a display module applied to a display apparatus in accordance with an exemplary embodiment.

FIG. 4 is an exploded perspective view showing a display module applied to a display apparatus in accordance with an exemplary embodiment.

Referring to FIG. 4, the display apparatus 1 includes a display module 100 that displays an image. The display module 100 includes a display panel 12, and a backlight unit 15 is disposed on a rear side of the display panel 12.

In a space between the display panel 12 and the backlight unit 15, a diffusing plate 14 for allowing light transmitted from the rear side to be diffused and transmitted to the display panel 12 positioned on the front side may be provided. The display panel 12 and the diffusing plate 14 may be supported by a middle mold 13, and a top chassis 11 is coupled to the front side of the middle mold 13, so that a state in which the display panel 12 is provided in the middle mold 13 is held.

A bottom chassis 16 is coupled to the rear side of the middle mold 13, and the backlight unit 15 is disposed on both inner sides of the bottom chassis 16. A light guide plate 140b is provided on the front side of the bottom chassis 16 so that light emitted from the backlight unit 15 can be uniformly dispersed. On the front side of the diffusing plate 14, optical sheets 140a for improving optical characteristics of light irradiated from the backlight unit 15 may be disposed.

The display panel 12 may be formed with a curvature that is changed depending on portions of the display panel 12 while proceeding toward both sides of the display panel 12 from the center portion thereof. In this instance, the display panel 12 may be formed with the curvature in which both sides are symmetric with each other with respect to the center portion of the display panel 12.

The display module 100 built in the display apparatus 1 may be formed with a curvature corresponding to the curvature of the display apparatus 1. Thus, each of the display panel 12, the diffusing plate 14, the middle mold 13, the top chassis 11, and the bottom chassis 16 which constitute the display module 100 is formed with a predetermined curvature. Therefore, both end portions of the respective component may protrude forward in relation to the center portion thereof. The curvatures of the respective components may be identical with each other, or different depending on a design.

The display panel 12 may be also defined as a liquid crystal display panel. The display panel 12 includes a thin film transistor substrate in which a thin film transistor is formed, a color filter substrate facing the thin film transistor substrate, and a liquid crystal layer provided between the thin film transistor substrate and the color filter substrate.

The display panel 12 includes a flexible PCB 122 provided on one side of the thin film transistor substrate, a driving chip 123 (e.g., driving chip 123 of FIG. 5) mounted in the flexible PCB 122, and a source printed circuit board 124 connected to the other side of the flexible PCB 122. On the side surface of the display panel 12, a gate driving unit 125 that drives gate lines of the display panel 12 may be further provided.

The backlight unit 15 may be disposed on both inner sides of the bottom chassis 16 to irradiate the inner center side of the bottom chassis 16 with light. The backlight unit 15 includes a pair of substrates 150 which extend vertically and are disposed on the inner side of both ends of the bottom chassis 16, and a plurality of light emitting diodes 151 which are disposed so as to be spaced apart from each other on the pair of substrates 150. The backlight unit 15 may be provided in various forms without being limited to the exemplary embodiment shown in FIG. 5.

The display panel 12 and the top chassis 11 are sequentially provided on the front side of the middle mold 13. The bottom chassis 16 is provided on the rear side of the middle mold 13 to allow the display panel 12 and the bottom chassis 16 to be kept spaced apart from each other while supporting the respective components.

The top chassis 11 includes a bezel portion 11a that covers an external peripheral side of a front surface of the display panel 12 and a top side surface portion 11b that is bent toward the rear side of the display panel 12 at an end portion of the bezel portion 11a to cover a side surface of the middle mold 13.

The bottom chassis 16 includes a rear surface portion 160a that forms a rear surface of the display module 100 and a bottom side surface portion 160b that extends toward the front side of the display panel 12 from a periphery of the rear surface portion 160a to be coupled to the middle mold 13. The bottom chassis 16 is provided in the form of a curved surface in which both side ends of the bottom chassis 16 protrude forward in relation to the center portion thereof, Therefore, the rear surface portion 160a of the bottom chassis 16 is also provided in the form of a curved surface in which both side ends of the rear surface portion 160a protrude forward in relation to the center portion thereof. The bottom chassis 16 may be manufactured as a metal plate such as aluminum so that heat generated from the backlight unit 15 can be efficiently radiated.

Figure 5:
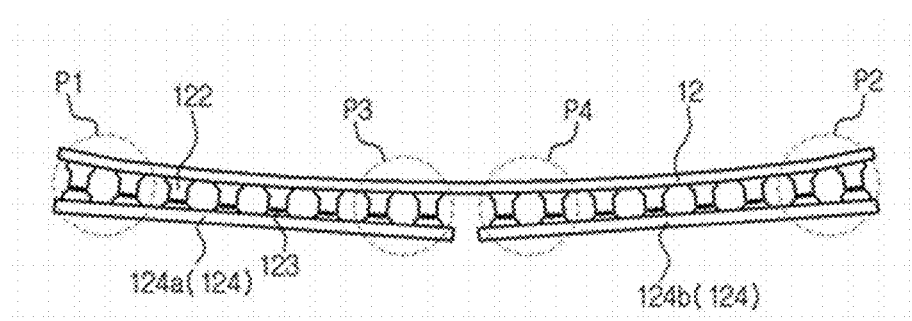
FIG. 5 is a schematic view showing a state of a display module in accordance with an exemplary embodiment, when viewed from the side.
Figure 6:
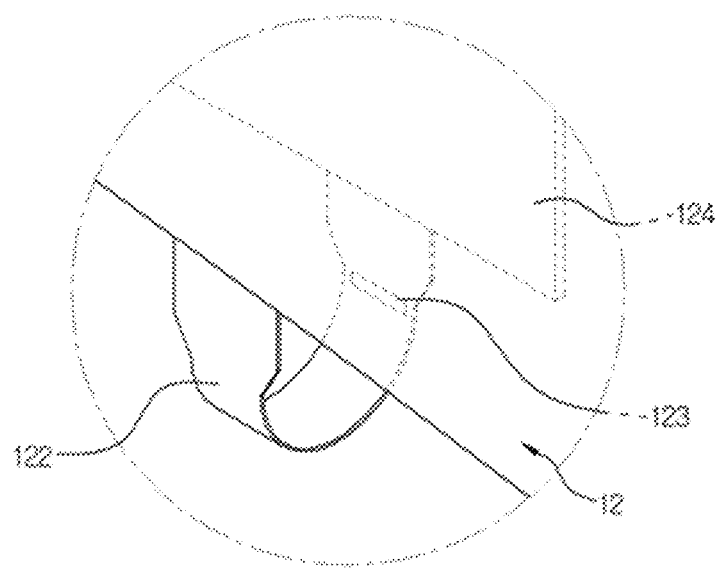
FIG. 6 is a view showing a state in which a flexible PCB of FIG. 4 is bent.

FIG. 5 is a schematic view showing a state of a display module in accordance with an exemplary embodiment, when viewed from the side, and FIG. 6 is a view showing a state in which a flexible PCB of FIG. 4 is bent.

Referring to FIGS. 5 and 6, the source printed circuit board 124 for controlling the display panel 12 may be provided on the rear side of the display panel 12 in accordance with an exemplary embodiment. The display panel 12 and the source printed circuit board 124 are connected with each other through a plurality of flexible PCBs 122. One side of the flexible PCB 122 may be bonded to the display panel 12, and the other side thereof may be bonded to the source printed circuit board 124.

The source printed circuit board 124 in accordance with the present embodiment includes a first source printed circuit board 124a and a second source printed circuit board 124b. The first source printed circuit board 124a may be positioned on a left side of the display panel 12, and the second source printed circuit board 124b may be positioned on a right side of the display panel 12. Each of the first source printed circuit board 124a and the second source printed circuit board 124b may be connected to the display panel 12 by the plurality of flexible PCBs 122. The number of source printed circuit boards 124 is not limited to the above-described embodiment, and the source printed circuit board 124 may be divided into a larger number of source printed circuit boards.

The flexible PCB 122 extends from the lower end of the display panel 12 toward the source printed circuit board 124 that is disposed on the lower rear side of the display panel 12 so as to be spaced apart from the display panel 12 to thereby connect the display panel 12 and the source printed circuit board 124. A circuit for transmitting electric power and signals may be provided inside the flexible PCB 122.

The flexible PCB 122 may be bent so as to connect the display panel 12 and the source printed circuit board 124 which are disposed in front and rear directions. The flexible PCB 122 may be bent into a U-shape so as to connect the display panel 12 and the source printed circuit board 124.

As an example, the flexible PCB 122 may extend to the external side of the bottom chassis 16, and be bent so as to wrap one end portion of the bottom chassis 16. When the flexible PCB 122 is bent, the source printed circuit board 124 connected to the other side of the flexible PCB 122 may be positioned on the rear side of the bottom chassis 16.

Figure 7:
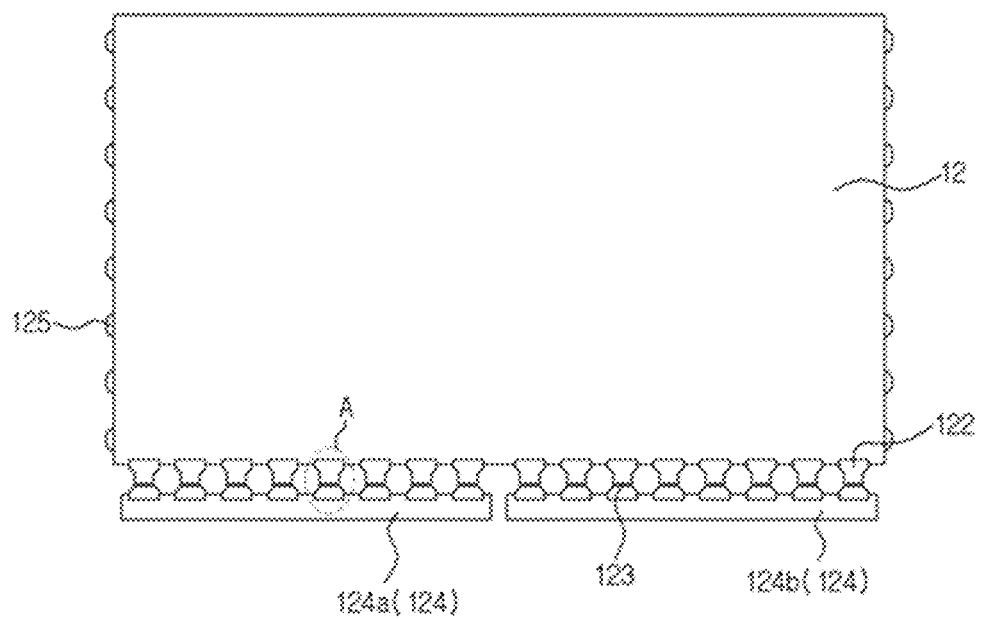
FIG. 7 is a schematic view showing a state of a display panel to which a flexible PCB in accordance with an exemplary embodiment is applied, when viewed from the bottom.
Figure 8:
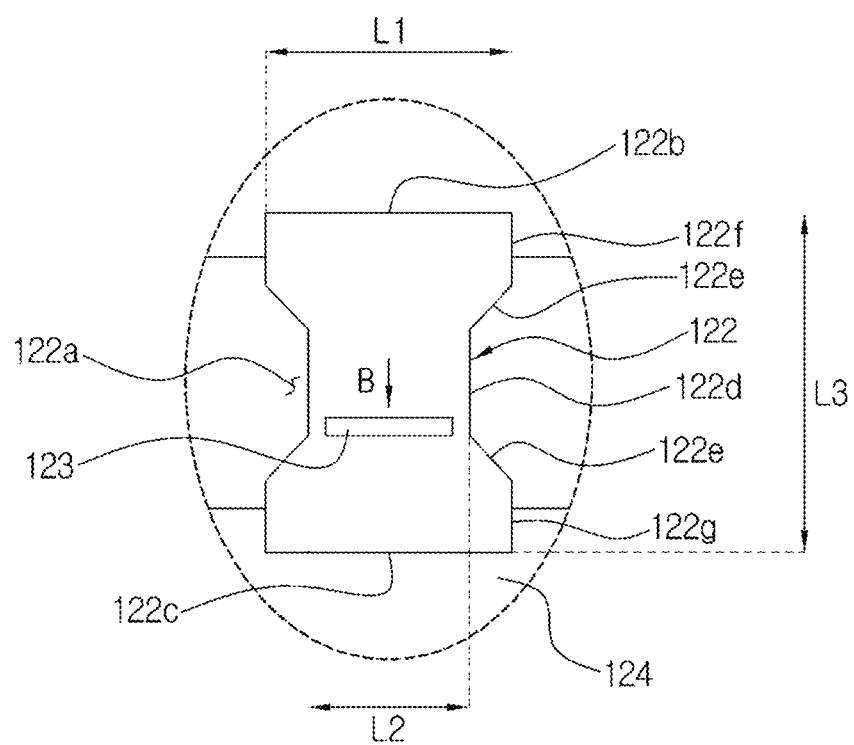
FIG. 8 is a view showing a flexible PCB in accordance with an exemplary embodiment.

FIG. 7 is a schematic view showing a state of a display panel to which a flexible PCB in accordance with an exemplary embodiment is applied, when viewed from the bottom, and FIG. 8 is a view showing a flexible PCB in accordance with an exemplary embodiment.

When one side of the flexible PCB 122 is connected to the display panel 12 having a predetermined curvature and the other side thereof is connected to the first source printed circuit board 124a and the second source printed circuit board 124b, the first source printed circuit board 124a and the second source printed circuit board 124b may receive a force causing them to be bent corresponding to the curvature of the display panel 12.

In this instance, a tension may be applied to the flexible PCB 122 by the first source printed circuit board 124a and the second source printed circuit board 124b which are highly likely to be bent. A tension larger than that applied to the flexible PCBs 122 positioned in the middle portion may be applied to the flexible PCBs 122 positioned in both end portions P1, P2, P3, and P4 (see FIGS. 4-5) of each of the first and second source printed circuit boards 124a and 124b. The tension applied to the flexible PCBs 122 may be continuously applied to the flexible PCBs 122 after the display panel 12 and the source printed circuit board 124 are connected with each other by the flexible PCBs 122.

In a related art display apparatus, the flexible PCBs are formed into the same rectangular shape to connect the source printed circuit board and the display panel. In this instance, a tension larger than that applied to the flexible PCBs positioned in the middle portion of the first and second source printed circuit boards is applied to the flexible PCBs positioned in the both end portions P1, P2, P3, and P4 of each of the first and second source printed circuit boards. When the flexible PCBs positioned in the both end portions P1, P2, P3, and P4 are bent so as to wrap one end portion of the bottom chassis, e.g., when the tension is continuously applied to the flexible PCBs in a state in which both side edges of the flexible PCB are kept vulnerable to tension, damage such as tearing may occur. In this case, reliability and life of the related art display apparatus may be affected.

The flexible PCB 122 in accordance with an exemplary embodiment may be deformable in its shape in such a manner that a magnitude of the tension applied to the edge sides of the flexible PCB 122 is reduced. As an example, the flexible PCB 122 may be provided into a shape in which at least one side of the rectangular shape is incised.

A cut portion 122a may be formed in one side or both sides of the flexible PCB 122. The cut portion 122a is formed. Therefore, a width L1 of an upper end portion 122b or a lower end portion 122c of the flexible PCB 122 may be formed longer than a width L2 of a middle portion 122d of the flexible PCB 122. At least partial edge 122e connecting the upper end portion 122b or the lower end portion 122c and the middle portion 122d may extend in a direction oblique with respect to the upper end portion 122b or the lower end portion 122c.

That is, in order for the at least partial edge 122e of side edges 122e, 122f, and 122g of the flexible PCB 122 not to extend along the shortest length L3 of the flexible PCB 122 connecting the display panel 12 and the source printed circuit board 124, the flexible PCB 122 may include a portion that extends while having a predetermined inclination angle with the lower end portion of the display panel 12 or with one end portion of the source printed circuit board 124, rather than being perpendicular thereto. When the flexible PCB 122 is bent, the at least partial edge 122e that extends in the oblique direction may be wound on one side end of the bottom chassis 16.

In this manner, the at least partial edge 122e that connects the upper end portion 122b or the lower end portion 122c of the flexible PCB 122 and the middle portion 122d thereof extends in the oblique direction. Therefore, a length of the side edges 122e, 122f, and 122g of the flexible PCB 122 may be longer than the shortest length L3 of the flexible PCB 122 connecting the display panel 12 and the source printed circuit board 124. The cut portion 122a is formed on the side of the flexible PCB 122 so that the length of the side edges 122e, 122f, and 122g of the flexible PCB 122 extending to the rear side of the bottom chassis 16 from the front side thereof is longer than the shortest length. Therefore, the flexible PCB 122 is prevented from being more tightly wound on the bottom chassis 16 compared to when the cut portion 122a is not formed on the side of the flexible PCB 122. As a result, a magnitude of the tension applied to the side edges of the flexible PCB 122 may be reduced in the exemplary embodiments in comparison to the related art.

A separation member (not shown) for preventing the flexible PCB 122 from being brought into contact with the top chassis 11 may be positioned in the cut portion 122a of the flexible PCB 122. The separation member may be positioned between the flexible PCBs 122 adjacent to each other. The top chassis 11 is supported by the separation member. Therefore, it is possible to prevent the flexible PCB 122 from being damaged by friction with the top chassis 11 or the like when packing or transporting the display apparatus 1.

When the flexible PCB 122 is bent, the driving chip 123 mounted in the flexible PCB 122 may be positioned on the rear side of the bottom chassis 16. That is, the driving chip 123 in accordance with the exemplary embodiment may be provided in a position moved under a position of a related art driving chip (e.g., moved down in a B direction), within the flexible PCB 122.

Specifically, the driving chip 123 in accordance with the exemplary embodiment may be mounted in a position adjacent to the source printed circuit board 124. When the flexible PCB 122 is bent, the driving chip 123 mounted in the flexible PCB 122 may be provided so as to be positioned on the rear side of the bottom chassis 16. As a result, it is possible to prevent the driving chip 123 from being damaged by other components inside the display module 100.

Figure 9:
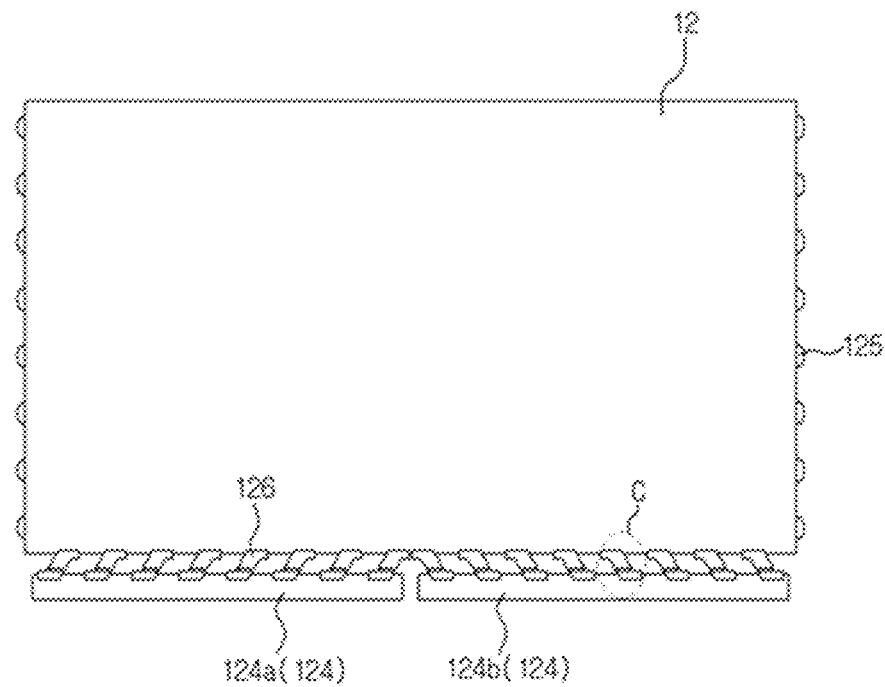
FIG. 9 is a view showing a display module to which a flexible PCB in accordance with another exemplary embodiment.
Figure 10:
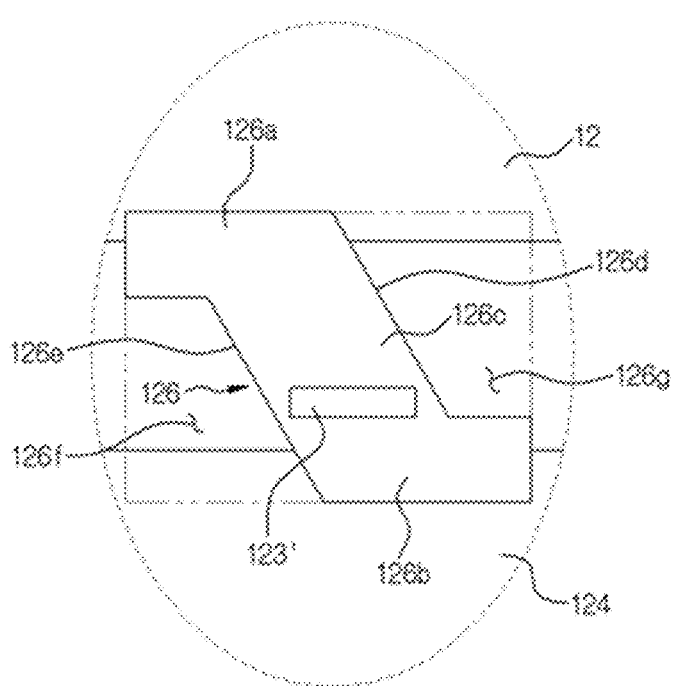
FIG. 10 is a view showing a portion C of FIG. 9.

FIG. 9 is a view showing a display module to which a flexible PCB in accordance with another exemplary embodiment is applied, and FIG. 10 is a view showing a portion C of FIG. 9.

Referring to FIGS. 9 and 10, a flexible PCB 126 in accordance with another exemplary embodiment includes a connection portion 126c that connects a first portion 126a mounted in the display panel 12 and a second portion 126b mounted in the source printed circuit board 124. The connection portion 126c may extend in an oblique direction.

That is, side edges 126d and 126e of the connection portion 126c may extend so as to have a predetermined inclination angle with the lower end portion of the display panel 12 or one end portion of the source printed circuit board 124, not extending along the shortest length between one end portion of the display panel 12 and the source printed circuit board 124.

For example, a part of side edges 126f and 126g of the flexible PCB 126 is incised so that the connection portion 126c may be provided so as to have the predetermined inclination angle with the lower end portion of the display panel 12 or the one end portion of the source printed circuit board 124.

The first portion 126a may extend on one side of the connection portion 126c in one direction, and the second portion 126b may extend on the other side thereof in the other direction. For example, as shown in FIG. 10, the first portion 126a of the flexible PCB 126 connected to the second source printed circuit board 124b may extend from the connection portion 126c in a left direction, and the second portion 126b may extend from the connection portion 126c in a right direction. In this instance, the connection portion 126c may extend from a left upper side toward a right lower side.

The inclination direction of the connection portion of the flexible PCB 126 connected to the first source printed circuit board 124a may be different from the inclination direction of the connection portion of the flexible PCB 126 connected to the second source printed circuit board 124b.

For example, the connection portion of the flexible PCB 126 connected to the first source printed circuit board 124a may be disposed from the right upper side toward the left lower side, and the connection portion of the flexible PCB 126 connected to the second source printed circuit board 124b may be disposed from the left upper side toward the right lower side. In this instance, the first portion 126a of the flexible PCB 126 connected to the first source printed circuit board 124a and the first portion 126a of the flexible PCB 126 connected to the second source printed circuit board 124b may be disposed so as to face each other. The first portion 126a of the flexible PCB 126 connected to the first source printed circuit board 124a may be disposed so as to face the second source printed circuit board 124b side, and the first portion 126a of the flexible PCB 126 connected to the second source printed circuit board 124b may be disposed so as to face the first source printed circuit board 124a side.

Therefore, the connection portion 126c is formed to extend in the oblique direction so that the lengths of the side edges 126d and 126e of the flexible PCB 126 are formed longer than the shortest length between the display panel 12 and the source printed circuit board 124. Therefore, the side edges 126d and 126e may not be tightened even though the flexible PCB 126 is bent so as to wrap one end portion of the bottom chassis 16. Thus, compared to when the lengths of the side edges 126d and 126e of the flexible PCB 126 are the same as the shortest length between the display panel 12 and the source printed circuit board 124, a magnitude of a tension applied to the side edges 126d and 126e of the flexible PCB 126 may be reduced to a greater degree.

A driving chip 123' may be mounted so as to be adjacent to the second portion 126b connected to the source printed circuit board 124. When the flexible PCB 126 is bent, the driving chip 123' mounted in the flexible PCB 126 may be positioned on the rear side of the bottom chassis 16. Thus, it is possible to prevent the driving chip 123' from being damaged by other components inside the display module 100.

A separation member (not shown) that enables the flexible PCB 126 and the top chassis 11 to be spaced apart from each other may be positioned in a space formed by the first portion 126a and the connection portion 126c and a space formed by the second portion 126b and the connection portion 126c, between the display panel 12 and the source printed circuit board 124. The separation member is provided to prevent the flexible PCB 126 from being damaged by the top chassis 11.

As described above, the side edges of the flexible PCBs 122 and 126 are formed to be oblique with respect to the lower end portion of the display panel 12 or the one end portion of the source printed circuit board 124. Therefore, the lengths of the side edges of the flexible PCBs 122 and 126 may be longer than the shortest length from the lower end of the display panel 12 to which one side of the flexible PCBs 122 and 126 is connected to the source printed circuit board 124 to which the other side of the flexible PCBs 122 and 126 is connected. Thus, the side edges of the flexible PCBs 122 and 126 may be provided with margins in their lengths even though the flexible PCBs 122 and 126 are wound on the bottom chassis 16. Therefore, in the exemplary embodiments, a magnitude of a tension applied to the flexible PCBs 122 and 126 may be reduced to a greater degree compared to when the lengths of the side edges of the related art flexible PCB are the same as the shortest distance from the lower end of the display panel to the source printed circuit board. As a result, in the exemplary embodiments, it is possible to prevent damage of the flexible PCBs 122 and 126 provided in the display apparatus 1 having the predetermined curvature.

In addition, the driving chips 123 and 123' mounted in the flexible PCBs 122 and 126 are positioned so as to be adjacent to the source printed circuit board 124, so that it is possible to prevent damage of the flexible PCBs 122 and 126 when the flexible PCBs are wound on the edge of the bottom chassis 16 to be bent. In the above, a case in which the driving chips 123 and 123' are mounted in the flexible PCBs 122 and 126 adjacent to the source printed circuit board 124 has been described, but the positions of the driving chips 123 and 123' are not limited thereto. For example, the driving chips 123 and 123' may be positioned so as not to be damaged by the edges of the bottom chassis 16 or the like due to bending of the flexible PCBs 122 and 126. For example, the driving chips 123 and 123' may be positioned in the flexible PCBs 122 and 126 adjacent to the display panel 12.

In the exemplary embodiments, by deforming the shape of the flexible PCB included in the display apparatus having the predetermined curvature, it is possible to prevent damage of the flexible PCB. In addition, by changing the position of the driving chip mounted in the flexible PCB, it is possible to prevent damage of the driving chip. As a result, in the exemplary embodiments, it is possible to increase the life of the display apparatus and improve reliability of a product.

As is apparent from the above description, the display apparatus in accordance with an exemplary embodiment may prevent the damage of the flexible PCB or the driving chip when the display panel is formed with a curved surface.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A curved display apparatus comprising:
a curved display panel configured to display an image;
a source printed circuit board (PCB) configured to control the curved display panel; and
a flexible printed circuit board (PCB) that connects the curved display panel and the source printed circuit board,
wherein the flexible PCB is directly connected to the curved edge of the curved display panel,
wherein a driving chip is disposed in the flexible PCB at a position offset from the center of the flexible PCB, and disposed at a rear side of the curved display panel when the flexible PCB is bent,
wherein the flexible PCB is provided so as to incline in a direction oblique with respect to one side end portion of the curved display panel or one side end portion of the source PCB, and
wherein when a plurality of source printed circuit boards are provided, an oblique direction of the flexible PCB connected to one source PCB is different from an oblique direction of the flexible PCB connected to the other source PCB.

2. The curved display apparatus according to claim 1, wherein the driving chip is disposed in the flexible PCB at a position biased to the curved display panel side and offset from a center portion of the flexible PCB.

3. The curved display apparatus according to claim 2, wherein the driving chip is disposed in the flexible PCB at a position closer to the source printed circuit board than the curved display panel.

4. The curved display apparatus according to claim 1, wherein a cut portion incised toward an inner side of the flexible PCB is disposed on at least one side of the flexible PCB.

5. The curved display apparatus according to claim 1, wherein the flexible PCB includes a first portion connected to one of the curved display panel and the source printed circuit board, a second portion connected to the other of the curved display panel and the source printed circuit board, and a connection portion which connects the first portion and the second portion.

6. The curved display apparatus according to claim 5, wherein the first portion extends away from one side end of the connection portion in a first direction, and the second portion extends away from the other side end of the connection portion in a second direction.

7. The curved display apparatus according to claim 1, wherein a bottom chassis is disposed on a rear side of the curved display panel, and the flexible PCB is bent so that the source printed circuit board is disposed on a rear side of the bottom chassis.

8. The curved display apparatus according to claim 7, wherein, when the flexible PCB is bent so as to wrap a part of the bottom chassis, the driving chip mounted in the flexible PCB is disposed so as not to be interfered with by edges of the bottom chassis.

9. The curved display apparatus according to claim 8, wherein, when the flexible PCB is bent so as to wrap the part of the bottom chassis, the driving chip mounted in the flexible PCB is disposed on the rear side of the curved display panel.

10. The curved display apparatus according to claim 8, wherein, when the flexible PCB is bent so as to wrap the part of the bottom chassis, the driving chip mounted in the flexible PCB is disposed on a front side on which the curved display panel is disposed.

11. The curved display apparatus according to claim 1, wherein a top chassis for fixing a front side of the curved display panel is disposed on the front side of the display panel.

12. The curved display apparatus according to claim 11, wherein a plurality of flexible PCBs are provided, and a separation member is positioned between the flexible PCBs adjacent to each other to support the top chassis.

13. The curved display apparatus according to claim 1, wherein the curved display panel is configured to be curved.

14. The curved display apparatus according to claim 1, wherein the display panel is configured to be bendable.

15. The curved display apparatus according to claim 1, wherein a width of an upper end portion or a lower end portion of the flexible PCB is wider than a width of a center portion of the flexible PCB.

* * * * *